(12) United States Patent
Lai et al.

(10) Patent No.: US 8,517,054 B2
(45) Date of Patent: Aug. 27, 2013

(54) FLOW RESISTANCE DEVICE

(75) Inventors: Jeng-Ming Lai, Taipei Hsien (TW);
Ming-Chang Wu, Taipei Hsien (TW);
Wei-Chung Hsiao, Taipei Hsien (TW);
Shih-Huai Cho, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 235 days.

(21) Appl. No.: 12/792,752

(22) Filed: Jun. 3, 2010

(65) Prior Publication Data
US 2011/0174402 A1 Jul. 21, 2011

(30) Foreign Application Priority Data
Jan. 18, 2010 (TW) ................................. 99101191 A

(51) Int. Cl.
*F16K 47/08* (2006.01)
(52) U.S. Cl.
USPC .................................. 137/625.3; 137/625.33
(58) Field of Classification Search
USPC ..................... 137/625.28, 625.3, 625.33, 343;
251/89, 90, 91, 93, 95, 297; 361/678, 679.49,
361/692, 679.46, 690; 257/721, 712;
312/223.2, 236; 454/184
See application file for complete search history.

(56) References Cited

U.S. PATENT DOCUMENTS

| | | | | |
|---|---|---|---|---|
| 1,740,626 A | * | 12/1929 | Petrelli | 49/38 |
| 2,322,590 A | * | 6/1943 | Pickering et al. | 454/215 |
| 2,525,371 A | * | 10/1950 | Reynolds, Sr. | 454/276 |
| 2,628,549 A | * | 2/1953 | Stelmach | 454/128 |
| 2,751,839 A | * | 6/1956 | Moore | 454/212 |
| 3,363,536 A | * | 1/1968 | Dean, Jr. | 454/334 |
| 3,509,812 A | * | 5/1970 | James | 454/332 |
| 3,564,770 A | * | 2/1971 | Korbelic | 49/38 |
| 4,407,187 A | * | 10/1983 | Horney | 454/324 |
| 4,546,693 A | * | 10/1985 | McTaw, Jr. | 454/128 |
| 4,643,226 A | * | 2/1987 | Balz | 137/625.33 |
| 4,726,285 A | * | 2/1988 | Kelley | 454/297 |

(Continued)

FOREIGN PATENT DOCUMENTS

| | | |
|---|---|---|
| CN | 200969073 Y | 10/2007 |
| CN | 102103396 A | 6/2011 |
| JP | 200331981 | 1/2003 |
| TW | M243690 | 9/2004 |

OTHER PUBLICATIONS

Office action mailed on Apr. 16, 2012 for the Taiwan application No. 099101191, p. 2 line 9-14, line 18-21 and line 24-26, p. 3 line1-4, line 8-11, line 14-18 and line 22-26, p. 4 line 4-7 and line 11-14.

(Continued)

*Primary Examiner* — John K Fristoe, Jr.
*Assistant Examiner* — David Colon Morales
(74) *Attorney, Agent, or Firm* — Winston Hsu; Scott Margo

(57) ABSTRACT

By using a base in cooperation with a moving board, a first flowing area formed by a plurality of openings on the base may be partially blocked by the moving board moving relative to the base, thereby forming a second flowing area that provides different flow resistances. The flow resistance of an adjustable flow resistance device can be adjusted easily and dynamically, without replacing to another device. The flow resistance of the device may also be adjusted to various predefined default settings precisely and speedily by further applying a positioning mechanism that utilizes various predefined positioning holes or a rotary element.

18 Claims, 8 Drawing Sheets

(56) References Cited

U.S. PATENT DOCUMENTS

| | | | | |
|---|---|---|---|---|
| 4,877,059 | A * | 10/1989 | Popescu et al. | 137/637.1 |
| 5,207,614 | A * | 5/1993 | Passadore | 454/298 |
| 5,218,998 | A * | 6/1993 | Bakken et al. | 137/625.28 |
| 5,295,509 | A * | 3/1994 | Suto et al. | 137/625.33 |
| 5,349,986 | A * | 9/1994 | Sullivan et al. | 137/625.33 |
| 5,427,146 | A * | 6/1995 | Bakken et al. | 137/625.3 |
| 5,683,293 | A * | 11/1997 | Mohammed | 454/132 |
| 6,002,586 | A * | 12/1999 | Chen et al. | 361/695 |
| 6,297,950 | B1 * | 10/2001 | Erwin | 361/679.49 |
| 6,342,004 | B1 * | 1/2002 | Lattimore et al. | 454/184 |
| 7,059,299 | B2 * | 6/2006 | Clark | 123/337 |
| 7,189,158 | B2 * | 3/2007 | Motszko et al. | 454/143 |
| 7,663,881 | B2 | 2/2010 | Kuo | |
| 2008/0121296 | A1 * | 5/2008 | Vorenkamp et al. | 137/625.33 |
| 2008/0265723 | A1 * | 10/2008 | Kerrigan et al. | 312/223.2 |
| 2011/0134605 | A1 | 6/2011 | Chou | |

OTHER PUBLICATIONS

Office action mailed on Aug. 27, 2012 for the China application No. 201010100203.X, p. 3 line 6-20, line 24-25 and line 28-30, p. 4 line 1-2, line 4-5, line 9-19, line 21-22, line 24-25 and line 27-28, p. 5 line 2-7.

* cited by examiner

FLOW RESISTANCE DEVICE

BACKGROUND OF THE INVENTION

1. Field of the Invention

The present invention relates to a flow resistance device, and more particularly, to an adjustable flow resistance device having variable flow resistance.

2. Description of the Prior Art

Flow resistance devices are often applied on electronic devices such as blade-type servers. By allowing air flow to flow through a specific geometric structure, different amount of air may flow through different air ways to remove the heat generated by each system or component.

Generally, the greater the air flow passing through a system, the better the heat dissipating. In a blade-type server system having multiple hosts or in a single system having various components with different size, each host (or each component of a single system) should have its corresponding flow resistance. Hence, flow resistance devices with different pass way cross-sections are designed to for each specific flow resistance. Each of such flow resistance devices, however, satisfies only the need of one specific server system (or component, host). Any new component or host other than the originally designed one should take a new flow resistance device, which needs redesign. It is much inefficient to relocate each flow resistance device for every component or host or server.

SUMMARY OF THE INVENTION

The invention provides a flow resistance device, which is configured in an electronic device. The flow resistance device includes a base and a board. A channel is formed on the base for allowing air flow to pass. The board is disposed on the base and moveable between a first position and a second position of the base. When the board is positioned at the first position, the cross-section of the channel for the air flow to pass is smaller than the cross-section of the channel for the air flow to pass when the board is positioned at the second position.

The invention also provides a flow resistance device, which is configured in an electronic device. The flow resistance device includes a base, a first board, and a second board. A channel is formed on the base for allowing air flow to pass. Both the first board and the second board are detachably and interchangeably disposed on the base. When the first board is disposed on the base, the cross-section of the channel for the air flow to pass is smaller than the cross-section of the channel for the air flow to pass when the second board is disposed on the base.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
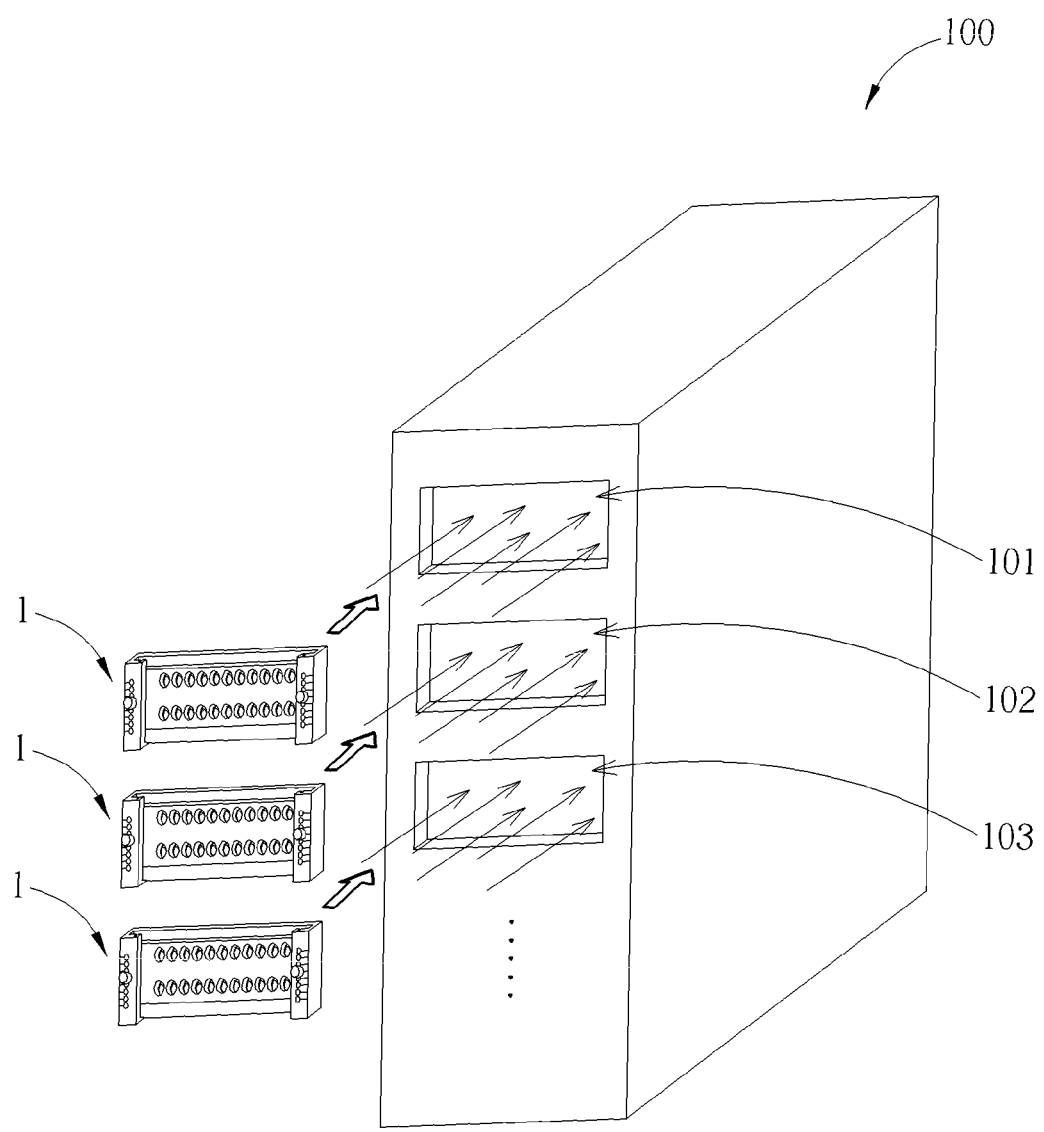
FIG. 1 is a schematic diagram showing a first embodiment of adjustable flow resistance devices of the invention, which are configured in channels for air flow to pass, of an electronic device.

Please refer to FIG. 1. FIG. 1 is a schematic diagram showing a first embodiment of adjustable flow resistance devices 1 of the invention, which are configured in channels 101, 102, 103, for air flow to pass, of an electronic device 100. The flow resistance device 1 may be utilized to configure at a blade-type server or electronic devices that need heat dissipation. The heat dissipating channels 101, 102, 103 mounted with flow resistance devices 1 having different flow resistances distribute or block air flow to adapt to various heat dissipation needs of different systems or components.

Figure 2:
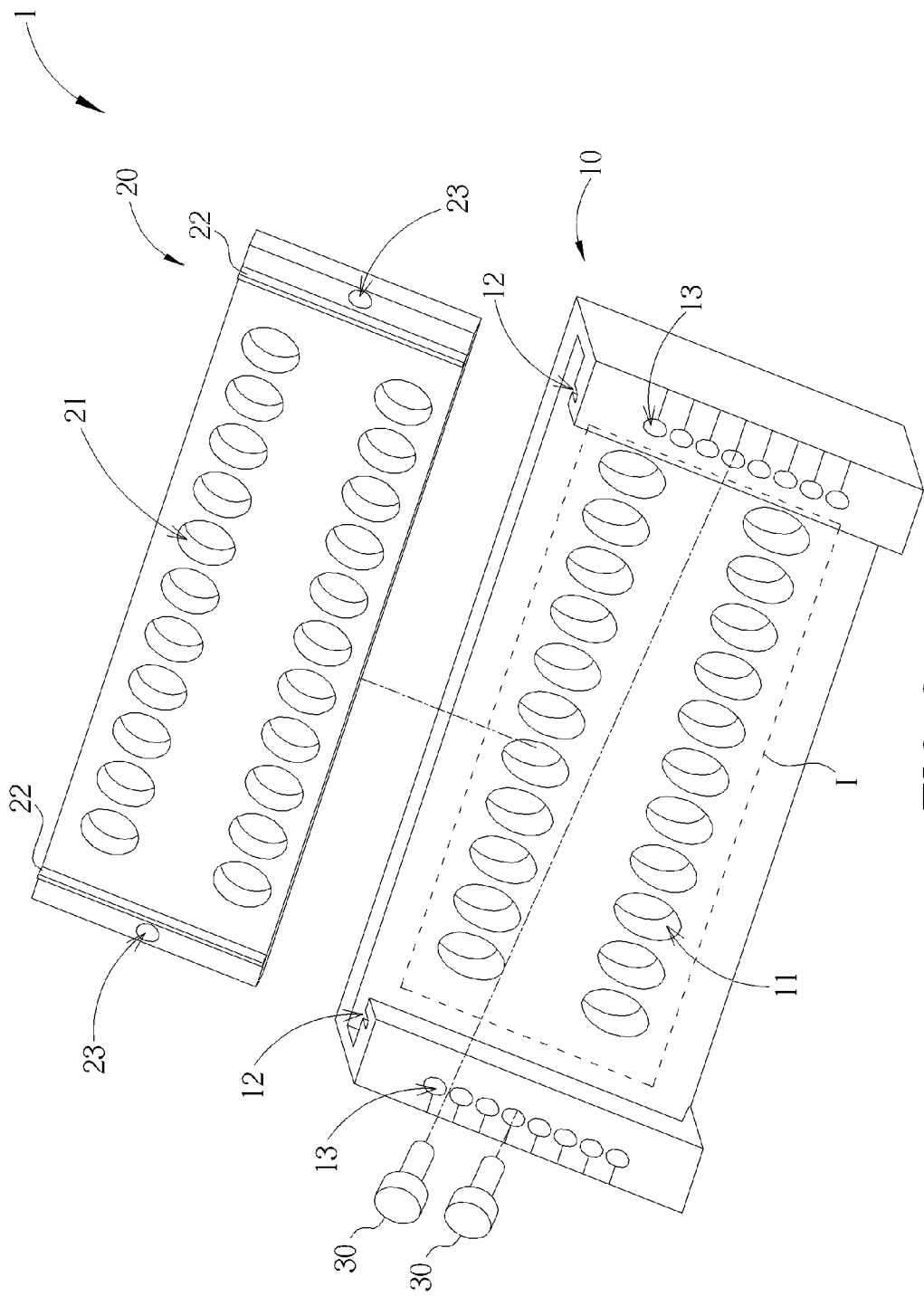
FIG. 2 is a schematic diagram showing an exploded view of the first embodiment of the flow resistance device.

Please refer to FIG. 2. FIG. 2 is a schematic diagram showing an exploded view of a first embodiment of the flow resistance device 1. The flow resistance device 1 includes a base 10 and a moveable board 20, which is disposed on the base 10 and moveable relative to the base 10. In the first embodiment, the base 10 and the moveable board 20 are both plate structure and the moveable board 20 is moveable along a linear direction $D_1D_2$ at the base 10. The base 10 has a plurality of openings 11 that form a first cross-section I at a channel where air flow passes. The first cross-section I has maximum area for the air flow to pass when using the flow resistance device 1. In other words, the flow resistance device 1 has maximum flow resistance for the air flow without the moveable board 20 disposed thereon or with the moveable board 20 but not blocking any opening at all. The base 10 has first slideways 12 at both sides, while the moveable board 20 has second slideways 22 at both sides. The moveable board 20 is moving relative to the base 10 by the two second slideways 22 at the sides of the moveable board 20 moving in each corresponding first slideway 12. The moveable board 20 also includes a plurality of openings 21, which in the first embodiment, correspond to the plurality of openings 11 of the base 10, both in position and in size. When the moveable board 20 moves relative to the base 10, each opening 21 partially blocks its corresponding opening 11. In other embodiments, the two-row openings 21 of the moveable board 20 may also be reduced to one row, like the moveable board 50 in another embodiment shown in FIG. 4, or the moveable board 20 simply has a lateral rectangular opening, like the moveable board 70 in another embodiment shown in FIG. 6. Either types of the moveable board 20 can partially block the openings 11 of the base 10 when moving relative to the base 10 and the overall unblocked area of the openings 11 can be adjusted to give the flow resistance device 1 various flow resistances.

Please be noted that a second cross-section II is formed at the channel of the flow resistance device 1 in the first embodiment by each opening 21 partially blocking corresponding opening 11, while in other embodiment, the second cross-section II may also be formed at the channel by using other types of moveable boards (like the ones in FIG. 4, FIG. 6, or boards having more than two rows of openings or different alignment of the openings) that can be moved relative to the base 10 and can selectively block some of the openings 11 or partial area of each opening 11.

Figure 3:
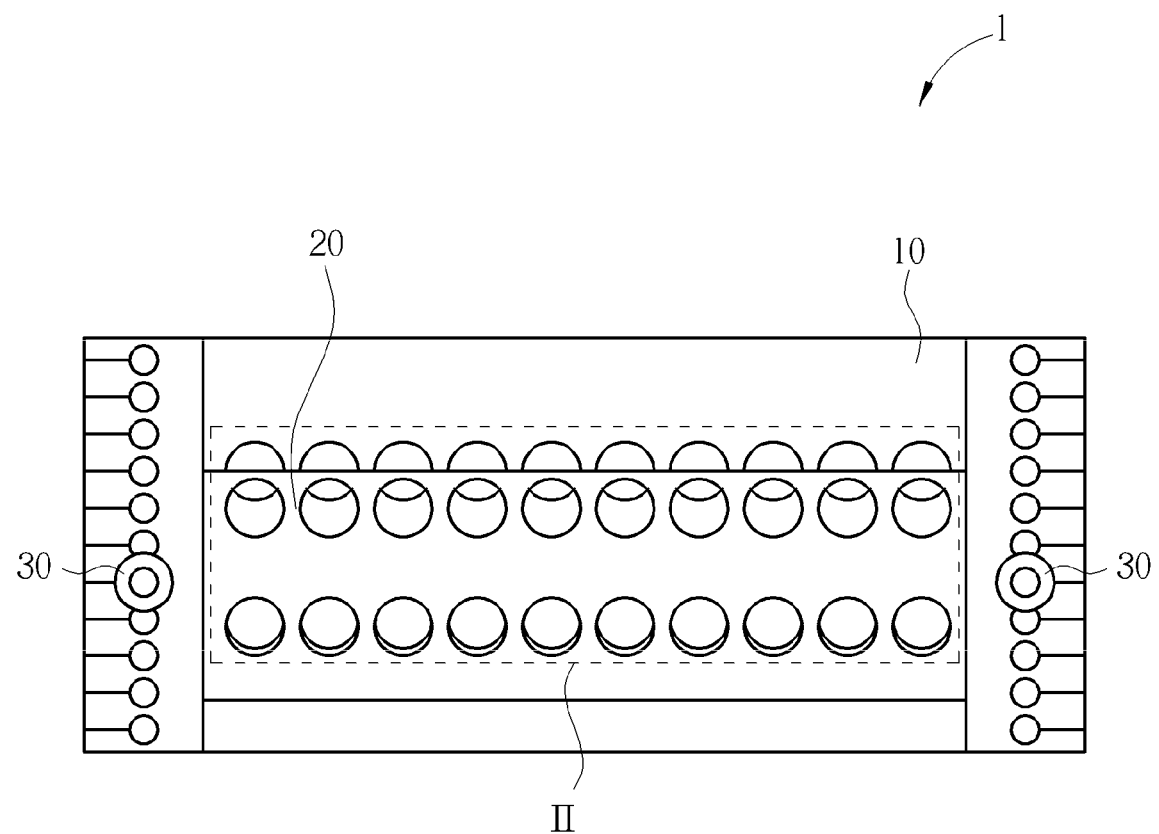
FIG. 3 is a schematic diagram of the first embodiment of flow resistance device showing a second cross-section.

Please refer to FIG. 3. FIG. 3 is a schematic diagram showing the moveable board 20 of the first embodiment disposed on the base 10 and moving to a certain predefined position and partially blocking the openings 11. Since the openings 11 of the base 10 are now partially blocked by the moveable board 20, the unblocked area of the openings 11 forms a second cross-section II, which is smaller than the overall area composed by all the openings 11, or the first cross-section I. In other words, the moveable board 20 moves relative to the base 10 to partially block the first cross-section I of the openings 11 and increases the flow resistance of the flow resistance device 1.

To add more convenience to the flow adjustability, based on different need of customization, the flow resistance device 1 may also include various cross-sections (predefined flows) according to flow resistance need and convert each cross-section into relative movement of the moveable board 20 relative to the base 10. Then by using a position mechanism to simplify the operation procedure, the flow resistance device 1 can have speedy, convenient adjustability of flow resistance. As FIG. 2 shows, a plurality of positioning holes 13 are configured at the first slideways 12 of the base 10, wherein in the first embodiment, the positioning holes 13 align in a linear way. The moveable board 20 has a through hole 23 on the second slideways 22. The flow resistance device 1 further includes a position part 30 as shown in FIG. 2. When the moveable board 20 moves relative to the base 10 until the through hole 23 aligns with one of the positioning holes 13, the relative position of the moveable board 20 and the base 10 forms an unblocked second cross-section II that corresponds to a predefined flow represented by the very positioning hole 13. The moveable board 20 and the base 10 may be further engaged together by passing the position part 30 through the positioning hole 13 and the through hole 23. As a result, the flow resistance of the flow resistance device 1 is conveniently adjusted to a predefined setting. To adjust the flow resistance of the flow resistance device 1 to another one, it only requires moving the position part 30 away and then moving the moveable board 20 so that the though hole 23 aligns with another one of the positioning holes 13 and then inserting the position part 30 again.

Figure 4:
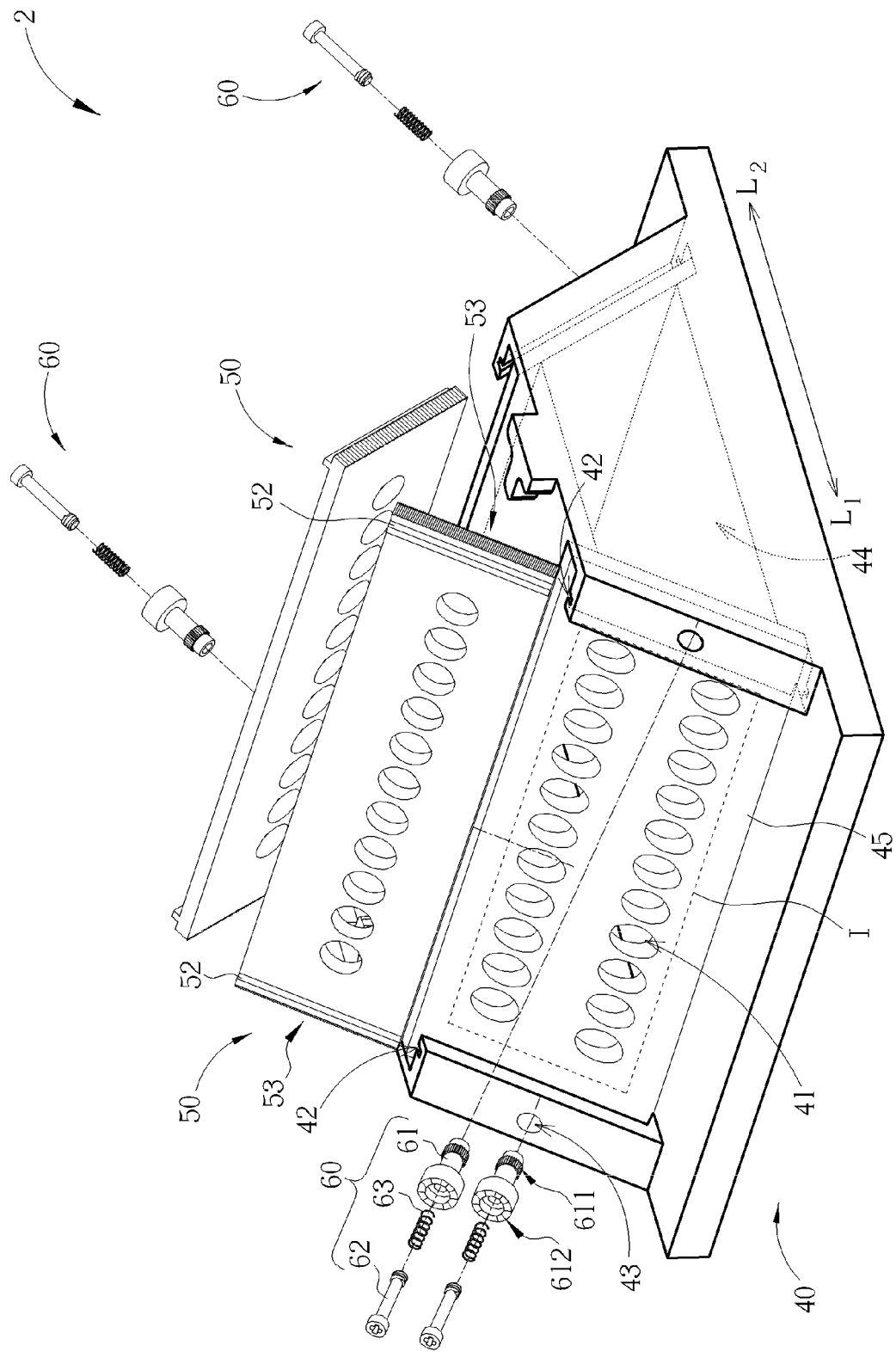
FIG. 4 is a schematic diagram showing an exploded view of a second embodiment of the flow resistance device.

Please refer to FIG. 4. FIG. 4 is a schematic diagram of a second embodiment of a flow resistance device 2. The second embodiment discloses a base 40 of wedge type, which has a channel 44. The flow resistance device 2 further includes a blocker 45 configured at the channel 44. The blocker 45 includes a plurality of openings 41 that form a first cross-section I, while the channel 44 has longitudinal depth along the direction $L_1L_2$ where the air flow passes. The moveable board 50 has one-row openings and can be disposed on either sides (the air inlet and the air outlet) of the base 40, or both sides of the base 40 as shown in FIG. 4.

Figure 5:
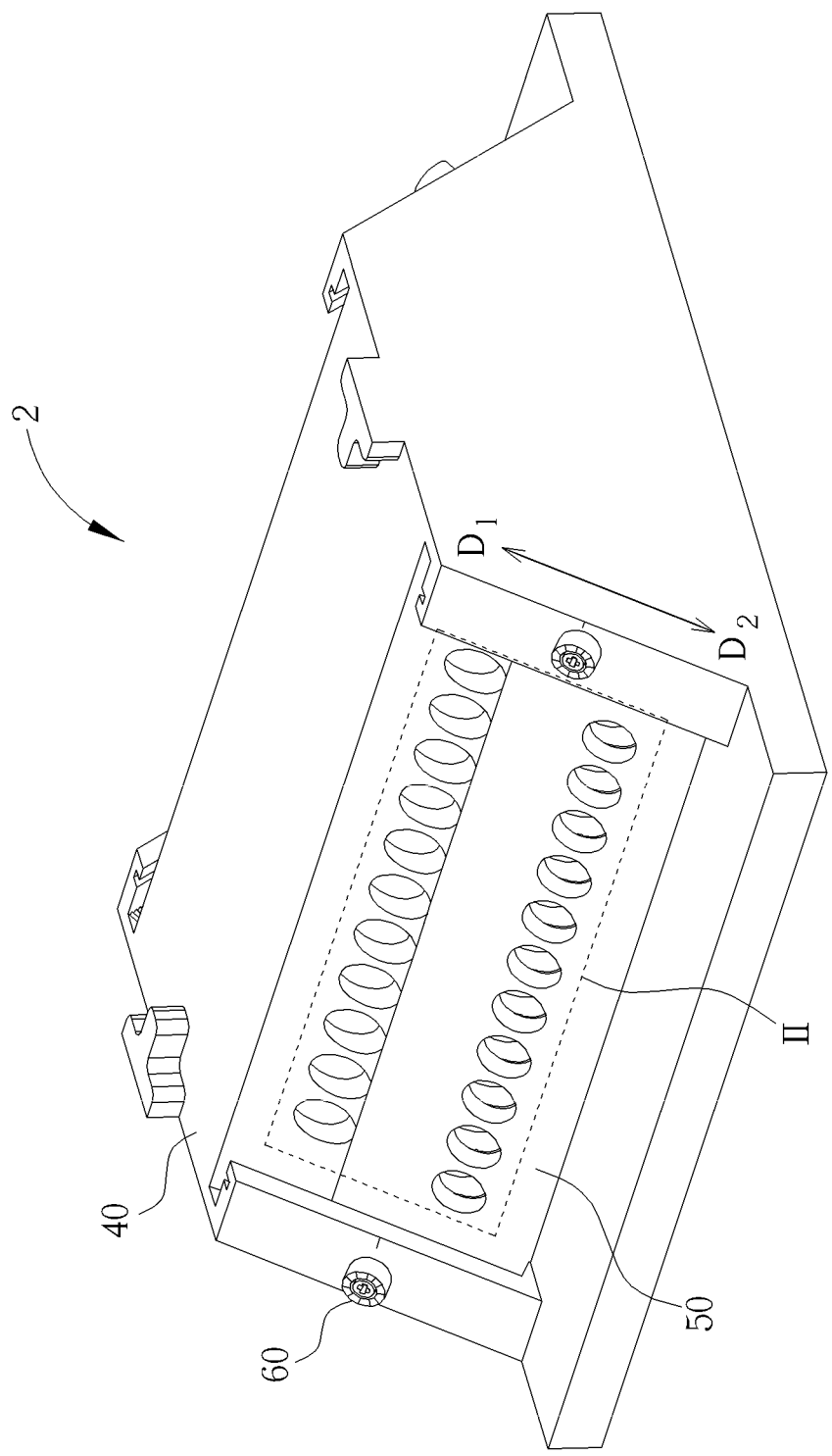
FIG. 5 is a schematic diagram of the second embodiment of the flow resistance device.

In the second embodiment, the movement of the moveable board 50 is adjusted via gear mechanism. Please also refer to FIG. 5, which shows that the moveable board 50 is disposed on the base 40 and adjusted to a position corresponding to one of the predefined flows of the second embodiment. The base 40 includes though holes 43 at the first slideways 42 at both sides and the moveable board 43 includes linear gears 53 at the second slideways 52. The flow resistance device 2 utilizes a position part 60 that rotates thereon to move the moveable board 50 to move relative to the base 40. The position part 60 includes a first screw 61, a second screw 62, and a spring 63. The first screw 61 inserts into the through hole 43 of the first slideway 42 with its gear 611 cooperating with the linear gear 53. When the first screw 61 rotates, the gear 611 moves the linear gear 53 and the moveable board 50 can be moved relative to the base 40 along a linear direction $D_1D_2$. The second screw 62 of the position part 60 inserts through the spring 63 and into the hollow part of the first screw 63 and engages with the base 40 with its end spiral line.

The flow resistance device 2, similar with the first embodiment, may also include various cross-sections (predefined flows) according to flow resistance need and convert each cross-section into relative movement of the moveable board 50 relative to the base 40. Then by using the position mechanism to simplify the operation procedure, the flow resistance device 2 can have speedy, convenient adjustability of flow resistance. The position part 60 of the second embodiment moves the moveable board 50 by rotating. Hence, a plurality of predefined flow scales 612 are set on the first screw 61, each flow scale 612 corresponding to a predefined rotation degree of the position part 60. When the position part 60 rotates to the degree that one flow scale 612 aligns with the horizontal line next to the position part 60, the movement of the moveable board 50 brought by the position part 60 gives the moveable board 50 and the base 40 a relative position and forms an unblocked second cross-section II, i.e., a predefined flow, at the channel 44. As a result, the flow resistance of the flow resistance device 2 is conveniently adjusted to a predefined setting. To adjust the flow resistance of the flow resistance device 2 to another one, it only requires rotating the position part 60 to another flow scale 612. Once the position part 60 rotates to a certain flow scale 612 and forms a second cross-section II between the moveable board 50 and the base 40, the second screw 62 is then used to fasten to the base 40 and retains the first screw 61 at such flow scale 612. Since the spring 63 is compressed by the fastened-up second screw 62, the spring will push the second screw 62 up as the second screw 62 is released for another adjustment.

Figure 6:
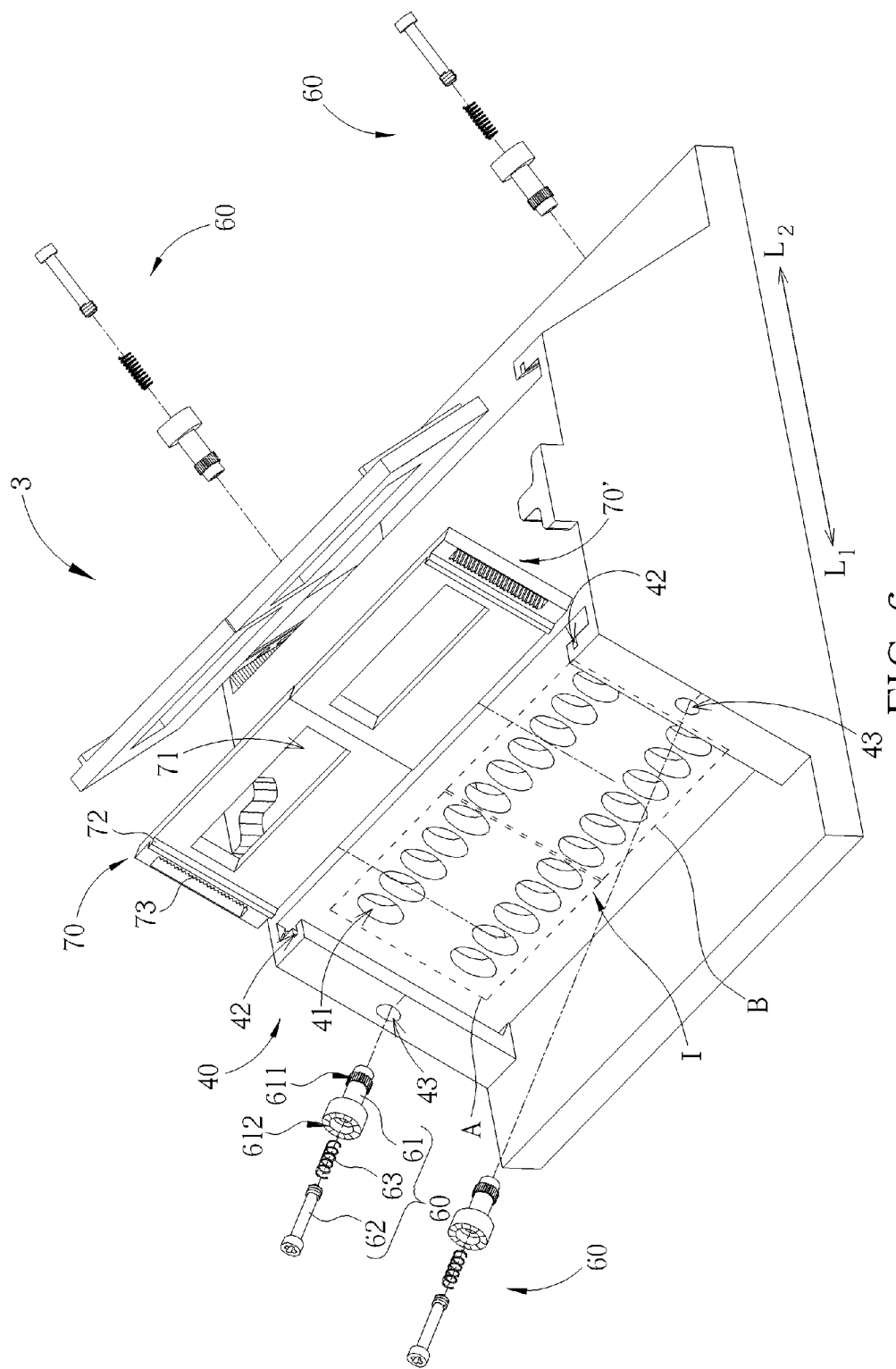
FIG. 6 is a schematic diagram showing an exploded view of a third embodiment of the flow resistance device.
Figure 7:
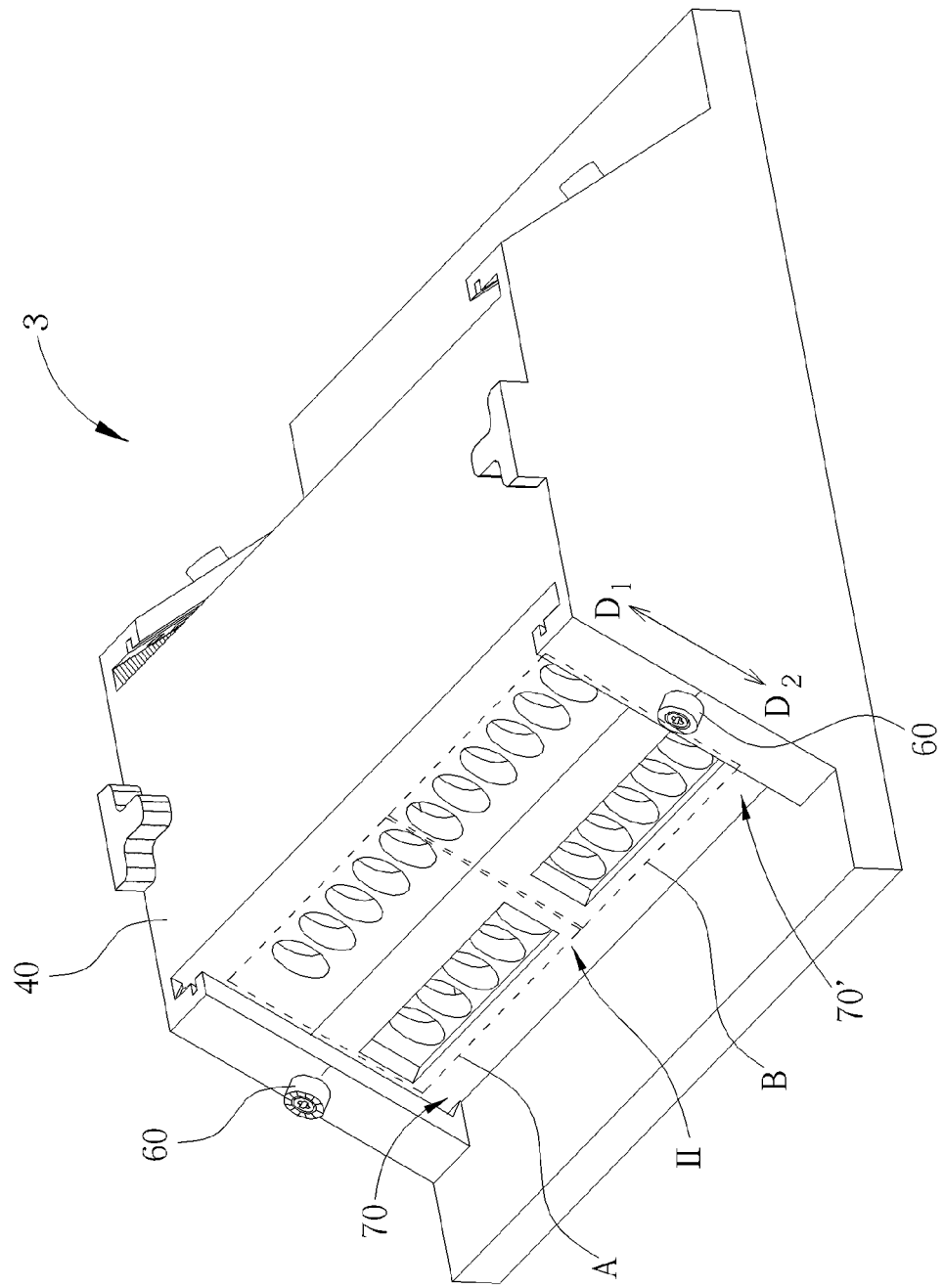
FIG. 7 is a schematic diagram of the third embodiment of the flow resistance device.

Please refer to FIG. 6 and FIG. 7, which show a third embodiment of a flow resistance device 3 according to the invention. The flow resistance device 3 has separate flow resistances at different zones. The first cross-section I formed by a plurality of openings 41 on the base 40 of the flow resistance device 3 includes zone A and zone B. In other words, the plurality of openings 41 are distributed in both zone A and zone B, while zone A and zone B are corresponding to a moveable board 70 and a moveable board 70' respectively.

The moveable board 70 (and the moveable board 70') has long rectangular opening 71 for adjusting the unblocked area of the openings 41. When the moveable board 70 uses a second slideway 72 to cooperate with a first slideway 42 so as to linearly move relative to the base 40 along direction $D_1D_2$, partial openings 41 expose at the rectangular opening 71 and form a second cross-section A' (a second cross-section B' exposed at the moveable board 70' is the same). The moveable board 70 is also brought to move and a position part 60 rotating a linear gear 73 at the second slideway 72, which has similar mechanism as the second embodiment shown in FIG. 4 and FIG. 5 and is omitted here of its detail description for brevity. In the third embodiment, the flow resistance device 3 can have different flow resistances by adjusting distinct moveable boards 70, 70' respectively for even complicated application.

Figure 8:
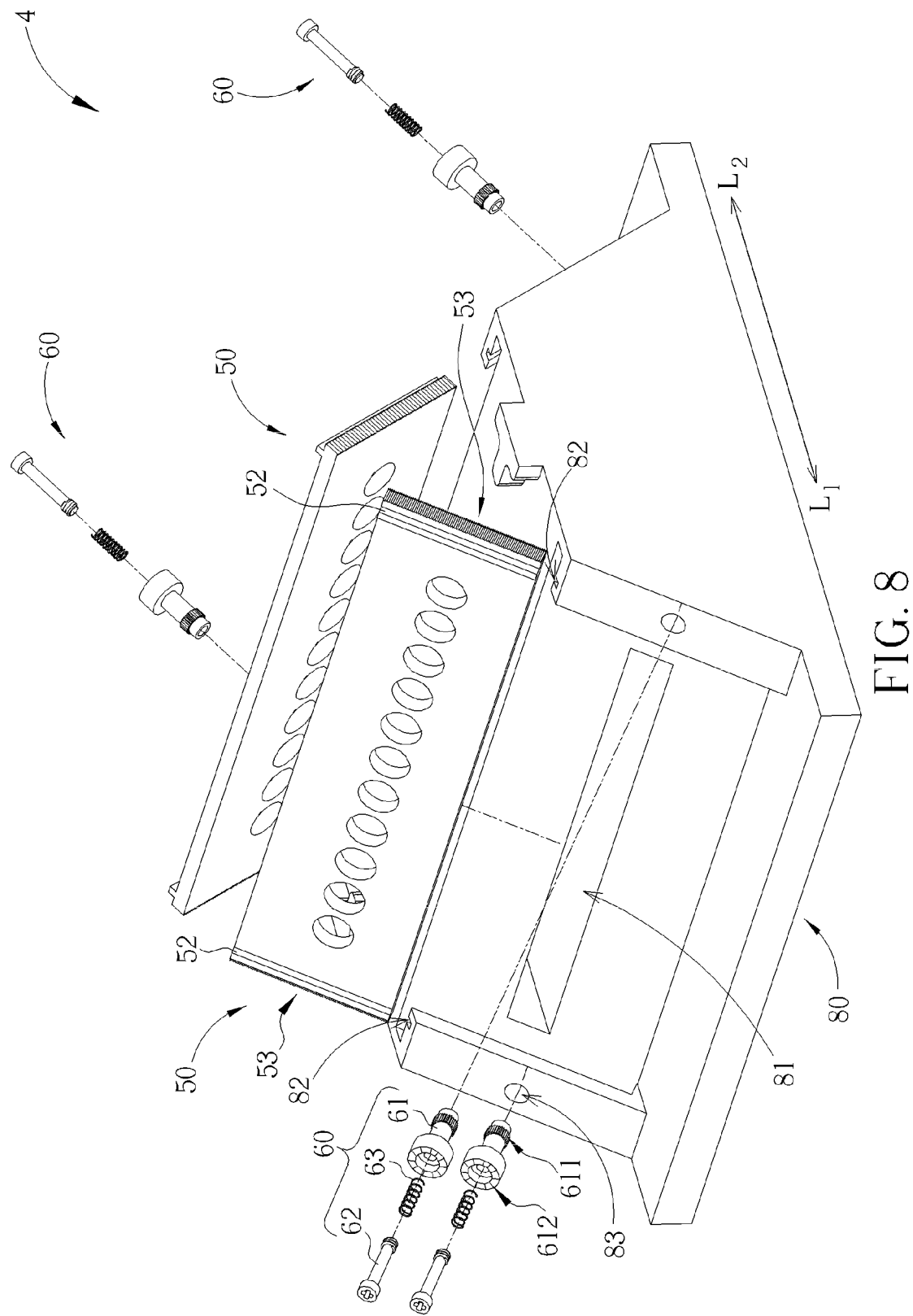
FIG. 8 is a schematic diagram showing an exploded view of a fourth embodiment of the flow resistance device.

Additionally, the channel of the base for allowing the air flow to pass may also be embodied as a long rectangular opening such as the opening 81 shown in a fourth embodiment of flow resistance device 4 in FIG. 8. The opening 81 may also add an additional blocker having openings to form as a similar base as shown in FIG. 2 to FIG. 7. As for the first slideways 82, the through hole 83, and other components of the flow resistance device 4 in the fourth embodiment, similar mechanism may be referred to any previous embodiments and is omitted here of its detail description. In still other embodiments of the invention, moveable boards with various opening size are also available for replacement for disposing on the base to form various cross-sections for the air flow to pass so that the flow resistance device can also have various flow resistances.

The flow resistance devices disclosed in the invention use the base in cooperation with the moving board(s), where a first flowing area is formed by the plurality of openings on the base and is partially blocked by the moving board(s) moving relative to the base, thereby forming a second flowing area that provides different flow resistance for the flow resistance devices. The flow resistance of such adjustable flow resistance devices can be adjusted easily and dynamically, without replacing to another device. The flow resistance of the devices may also be adjusted to various predefined default settings precisely and speedily by further applying a positioning mechanism that utilizes various predefined positioning holes or a rotary element.

Those skilled in the art will readily observe that numerous modifications and alterations of the device and method may be made while retaining the teachings of the invention.

What is claimed is:

1. A flow resistance device, which is configured in an electronic device, comprising:
    a base, wherein a channel is formed thereon for allowing air flow to pass, the base comprising a first slideway, the first slideway comprising a plurality of positioning holes;
    a blocker disposed at the channel and forming a plurality of openings with fixed shape; wherein the blocker is disposed within the first slideway;
    a board disposed on the base and moveable in the first slideway so as to be moved relative to the base and the blocker between a first position and a second position of the base and the blocker; and
    a position part for selectively engaging with one of the positioning holes and the board for maintaining the board at a selected position of the base;
    wherein the blocker is a plate and when the board is moved with respect to the blocker to be positioned at the first position, the cross-section of the plurality of openings for the air flow to pass is smaller than the cross-section of the plurality of openings for the air flow to pass when the board is moved with respect to the blocker to be positioned at the second position.

2. The flow resistance device of claim 1, wherein each of the positioning holes corresponds to one of a plurality of predefined flows, and the position part and the board engage with one of the plurality of positioning holes such that the cross-section of the channel for the air flow to pass corresponds to a corresponding one of the plurality of predefined flows.

3. The flow resistance device of claim 1, wherein the plurality of positioning holes align in a linear way.

4. The flow resistance device of claim 1, wherein the board comprises a second slideway moveable on the first slideway, the second slideway having a linear gear and the flow resistance device further comprising a position part rotatably configured at the first slideway of the base, the position part having gear for cooperating with the linear gear so as to move the board relative to the base when the position part rotates at the first slideway.

5. The flow resistance device of claim 4, wherein the position part comprises a plurality of predefined flow scales, each corresponding to a predefined rotation degree of the position part; when the position part rotates at the first slideway to move the board relative to the base, the plurality of predefined flow scales and corresponding predefined rotation degrees set the cross-sections of the channel for the air flow to pass to correspond to a plurality of predefined flows respectively.

6. The flow resistance device of claim 1, wherein when the board is positioned at the first position, the cross-section of the channel for the air flow to pass is comprised by each partial area of the plurality of openings.

7. The flow resistance device of claim 1, wherein when the board is positioned at the first position, the cross-section of the channel for the air flow to pass is comprised by area of some of the plurality of openings.

8. The flow resistance device of claim 1, wherein the board is disposed on the base and moveable relative to the base along a linear direction.

9. The flow resistance device of claim 1, wherein the base and the board are plate structure.

10. The flow resistance device of claim 1, wherein the base is a wedge base where the channel has longitudinal depth along the direction of the air flow to pass and the board is plate structure.

11. The flow resistance device of claim 1, further comprising a second board moveable relative to the base, wherein the channel of the base for the air flow to pass comprises a first section and a second section, the cross-section of the first section differs with the movement of the board relative to the base, and the cross-section of the second section differs with the movement of the second board relative to the base.

12. A flow resistance device, which is configured in an electronic device, comprising:
    a base, wherein a channel is formed thereon for allowing air flow to pass, the base comprising a first slideway, the first slideway comprising a plurality of positioning holes;
    a first board and a second board in a replacement relation, one of the first board and the second board at a time detachably disposed on the base, each of the first board and the second board comprising a second slideway for moving in the first slideway such that the first board or the second board is moveable relative to the base; and
    a position part for selectively engaging with one of the positioning holes together with the first board or the second board for maintaining the first board or the second board at a selected position of the base;
    wherein when the first board is disposed on the base, the cross-section of the channel for the air flow to pass is smaller than the cross-section of the channel for the air flow to pass when the second board is disposed on the base.

13. The flow resistance device of claim 12, wherein each of the positioning holes corresponds to one of a plurality of predefined flows, and the position part together with the first board or the second board engage with one of the plurality of positioning holes such that the cross-section of the channel for the air flow to pass corresponds to a corresponding one of the plurality of predefined flows.

14. The flow resistance device of claim 12, wherein the plurality of positioning holes align in a linear way.

15. The flow resistance device of claim 12, wherein each second slideway of the first board and the second board has a linear gear and the flow resistance device further comprises position part rotatably configured at the first slideway of the base, the position part having gear for cooperating with each linear gear so as to move the first board or the second board relative to the base when the position part rotates at the first slideway.

16. The flow resistance device of claim 15, wherein the position part comprises a plurality of predefined flow scales, each corresponding to a predefined rotation degree of the position part; when the position part rotates at the first slideway to move the first board or the second board relative to the base, the plurality of predefined flow scales and corresponding predefined rotation degrees set the cross-sections of the channel for the air flow to pass to correspond to a plurality of predefined flows respectively.

17. The flow resistance device of claim 12, wherein the channel comprises a plurality of openings, when the first board is disposed on the base, the cross-section of the plurality of openings for the air flow to pass being smaller than the cross-section of the plurality of openings for the air flow to pass when the second board is disposed on the base.

18. The flow resistance device of claim 12, wherein the first board or the second board is disposed on the base and moveable relative to the base along a linear direction.

\* \* \* \* \*